(12) United States Patent
Suzuki et al.

(10) Patent No.: US 11,227,881 B2
(45) Date of Patent: Jan. 18, 2022

(54) THIN-FILM TRANSISTOR AND METHOD FOR MANUFACTURING SAME, ARRAY SUBSTRATE, AND DISPLAY DEVICE

(71) Applicant: Truly (Huizhou) Smart Display Limited, Guangdong (CN)

(72) Inventors: Koji Suzuki, Guangdong (CN); Zhuo Chen, Guangdong (CN); Yixian Zhang, Guangdong (CN); Fan Zhang, Guangdong (CN); Siyu Ren, Guangdong (CN); Junhai Su, Guangdong (CN); Jianhua Li, Guangdong (CN)

(*) Notice: Subject to any disclaimer, the term of this patent is extended or adjusted under 35 U.S.C. 154(b) by 120 days.

(21) Appl. No.: 16/648,248

(22) PCT Filed: Jul. 6, 2018

(86) PCT No.: PCT/CN2018/094790
§ 371 (c)(1),
(2) Date: Mar. 18, 2020

(87) PCT Pub. No.: WO2019/062260
PCT Pub. Date: Apr. 4, 2019

(65) Prior Publication Data
US 2020/0235132 A1    Jul. 23, 2020

(30) Foreign Application Priority Data

Sep. 28, 2017 (CN) .......................... 201710898220.4

(51) Int. Cl.
*H01L 27/12* (2006.01)
*H01L 21/265* (2006.01)
(Continued)

(52) U.S. Cl.
CPC .......... *H01L 27/127* (2013.01); *H01L 21/266* (2013.01); *H01L 21/26513* (2013.01);
(Continued)

(58) Field of Classification Search
CPC . H01L 27/127; H01L 27/1222; H01L 27/124; H01L 27/1214; H01L 27/1259;
(Continued)

(56) References Cited

U.S. PATENT DOCUMENTS

2002/0021403 A1* 2/2002 Kim ...................... G02F 1/1362
349/187
2004/0004220 A1* 1/2004 Suzuki .............. H01L 29/66765
257/66
(Continued)

*Primary Examiner* — Eduardo A Rodela
(74) *Attorney, Agent, or Firm* — Prakash Nama; Global IP Services, PLLC

(57) ABSTRACT

Disclosed in the present invention are a method for manufacturing a thin-film transistor, an array substrate, and a display device. The method includes: forming a buffer layer on a substrate; forming a polysilicon layer on the buffer layer; performing a patterning process on the polysilicon layer, to form an active layer; depositing a gate insulating layer on the active layer; depositing a gate metal layer on the gate insulating layer, and performing dry etching on the gate metal layer by using the patterning process and by using a gas containing CO as an etching gas, to form a gate; performing ion implantation on the active layer by using the gate as a mask, to form a source region and a drain region; and depositing a passivation layer on the gate, forming through holes in the gate insulating layer and the passivation layer, and manufacturing a source and a drain.

17 Claims, 3 Drawing Sheets

(51) Int. Cl.
  *H01L 21/266* (2006.01)
  *H01L 21/3213* (2006.01)
  *H01L 29/49* (2006.01)
  *H01L 29/66* (2006.01)
  *H01L 29/786* (2006.01)

(52) U.S. Cl.
  CPC ...... *H01L 21/32136* (2013.01); *H01L 27/124* (2013.01); *H01L 27/1222* (2013.01); *H01L 27/1259* (2013.01); *H01L 27/1262* (2013.01); *H01L 29/4908* (2013.01); *H01L 29/66757* (2013.01); *H01L 29/78675* (2013.01)

(58) Field of Classification Search
  CPC ............ H01L 27/1262; H01L 27/1288; H01L 21/02595; H01L 21/26513; H01L 21/266; H01L 21/32136; H01L 21/763; H01L 21/76264; H01L 29/4908; H01L 29/66757; H01L 29/78675; H01L 2021/775; H01L 2924/13069
  See application file for complete search history.

(56) References Cited

U.S. PATENT DOCUMENTS

| | | | |
|---|---|---|---|
| 2007/0252145 A1* | 11/2007 | Toyota | H01L 27/124 257/59 |
| 2008/0048182 A1* | 2/2008 | Hatano | H01L 27/12 257/40 |
| 2008/0142808 A1* | 6/2008 | Lee | H01L 27/1214 257/72 |
| 2010/0012922 A1* | 1/2010 | Marsh | H01L 51/0048 257/14 |
| 2010/0084655 A1* | 4/2010 | Iwasaki | H01L 29/78618 257/43 |
| 2016/0307936 A1* | 10/2016 | Shin | H01L 27/1222 |
| 2018/0026138 A1* | 1/2018 | Yamaguchi | H01L 29/45 257/43 |

\* cited by examiner

THIN-FILM TRANSISTOR AND METHOD FOR MANUFACTURING SAME, ARRAY SUBSTRATE, AND DISPLAY DEVICE

CROSS REFERENCE TO RELATED APPLICATION

This application claims priority to Chinese Patent Application No. 201710898220.4, filed with the China National Intellectual Property Administration on Sep. 28, 2017, and entitled "THIN-FILM TRANSISTOR, METHOD FOR MANUFACTURING SAME, ARRAY SUBSTRATE, AND DISPLAY DEVICE", which is incorporated herein by reference in its entirety.

BACKGROUND OF THE INVENTION

The present invention relates to the field of semiconductor devices, and in particular, to a thin-film transistor, a method for manufacturing same, an array substrate, and a display device.

A thin-film transistor liquid crystal display (TFT-LCD) is the most important one in the field of flat-panel displays. The thin-film transistor liquid crystal display has many advantages, such as a thin size, a light weight, excellent image quality, low power consumption, a long life, and digitization, and is also the only display technology that can span all sizes. Therefore, the thin-film transistor liquid crystal display has a very wide range of applications, covering almost all major electronic products in today's information society, such as a television, a monitor, a laptop computer, a mobile phone, a PDA, a GPS, a vehicle-mounted display, an instrument, a meter, a public display, and medical display. An OLED (Organic Light-Emitting Diode, organic light-emitting diode), as a current-type light-emitting device, is increasingly applied to the high performance display field because the OLED has advantages, such as being self-luminous, a fast response, a wide viewing angle, and being capable of being manufactured on a flexible substrate. In an AMOLED (Active Matrix/Organic Light-Emitting Diode, active matrix/organic light-emitting diode) technology, each OLED scans input currents by lines through a TFT (Thin-film transistor, thin-film transistor) switch circuit.

As a gate material of a thin-film transistor used in the thin-film transistor liquid crystal display (TFT-LCD) and the AMOLED, molybdenum, tungsten, a molybdenum tungsten alloy, or the like is generally used. In a process of etching a gate metal layer by using a patterning process to form a gate, for example, when Mo is used as a material of the gate metal layer, two-step etching is generally performed. In a first step, a gas containing $SF_6$ is used. For example, a gas obtained by mixing $SF_6$ and $O_2$ is used as an etching gas to etch away a part of the gate metal layer. In a second step, a gas containing $Cl_2$ is used. For example, a gas obtained by mixing $Cl_2$ and $O_2$ is used as an etching gas to etch away a remaining gate metal layer. In the second step of the etching process, a gas such as $MoCl_2O_2$, $MoCl_4O$, or $MoCl_5$ is generated through a reaction. However, a reaction resultant such as $MoCl_2O_2$, $MoC_4O$, or $MoCl_5$ adheres to an etching chamber again due to low vapor pressure, easily making the cavity dirty. However, in the first step of the etching process, a gas such as $MoF_6$ or $MoF_4O$ is generated through a reaction, and a reaction resultant such as $MoF_6$ or $MoF_4O$ does not pollute the chamber due to high vapor pressure, and at the same time have a chamber cleaning effect. Therefore, in the prior art, the first step and the second step of the etching process are repeated to prevent the chamber from being polluted, but the pollution of the chamber cannot be completely prevented after the second step of the etching process. A gate insulating film under the gate metal layer is etched away by using a gas containing fluorine, and the gate insulating film is not etched away by using $Cl_2$ and $O_2$ as an etching gas. Therefore, in the existing technology, the gate cannot be formed by only using the foregoing first etching step, but the foregoing first step and second step of the etching process must be used to form the gate. In this way, chamber pollution is inevitably caused.

BRIEF SUMMARY OF THE INVENTION

Based on the embodiments disclosed in this application, a thin-film transistor, a method for manufacturing same, an array substrate, and a display device are provided.

A method for manufacturing a thin-film transistor is provided, including:

forming a buffer layer on a substrate;

forming a polysilicon layer on the buffer layer;

performing a patterning process on the polysilicon layer, to form an active layer;

depositing a gate insulating layer on the active layer;

depositing a gate metal layer on the gate insulating layer, and performing dry etching on the gate metal layer by using the patterning process and by using a gas containing CO as an etching gas, to form a gate;

performing ion implantation on the active layer by using the gate as a mask, to form a source region and a drain region; and depositing a passivation layer on the gate, forming through holes in the gate insulating layer and the passivation layer, and manufacturing a source and a drain.

A thin-film transistor is provided and manufactured by using the foregoing manufacturing method.

An array substrate is provided, including a substrate, and a gate line, a data cable, a pixel electrode, and the foregoing thin-film transistor that are disposed on the substrate.

A display device is provided, including the foregoing array substrate.

Details of one or more embodiments of the present invention are provided in the following accompanying drawings and descriptions. Other features, objectives, and advantages of the present invention become apparent in the specification, the accompanying drawings, and the claims.

BRIEF DESCRIPTION OF THE DRAWINGS

To better describe and illustrate embodiments and/or examples of those inventions disclosed herein, reference may be made to one or more accompanying drawings. Additional details or examples used to describe the accompanying drawings should not be considered as limiting the scope of any of the disclosed inventions, the currently described embodiments and/or examples, and a currently understood best mode of these inventions.

DETAILED DESCRIPTION OF THE INVENTION

To facilitate understanding of this application, this application is more comprehensively described below with reference to the related accompanying drawings. Preferred implementations of this application are provided in the accompanying drawings. However, this application can be implemented in many different forms, and is not limited to the implementations described in the specification. In contrast, an objective of providing these implementations is to provide a more thorough and comprehensive understanding of disclosed content of this application Unless otherwise defined, all technical and scientific terms used in the specification are the same as meanings that are commonly understood by a person of ordinary skill in the art and that belong to this application. The terms used in the specification of this application are only for the purpose of describing specific implementations, and are not intended to limit this application. The term "and/or" used in the specification includes any and all combinations of one or more of associated listed items.

For example, a schematic flowchart of a method for manufacturing a thin-film transistor includes: forming a buffer layer on a substrate; forming a polysilicon layer on the buffer layer; performing a patterning process on the polysilicon layer, to form an active layer; depositing a gate insulating layer on the active layer; depositing a gate metal layer on the gate insulating layer, and performing dry etching on the gate metal layer by using the patterning process and by using a gas containing CO as an etching gas, to form a gate; performing ion implantation on the active layer by using the gate as a mask, to form a source region and a drain region; and depositing a passivation layer on the gate, forming through holes in the gate insulating layer and the passivation layer, and manufacturing a source and a drain.

In the method for manufacturing the thin-film transistor in this embodiment, in the process of etching the gate metal layer by using the patterning process to form the gate, the gas containing CO is used as the etching gas, and a generated reaction resultant has high vapor pressure, does not adhere to an etching chamber, and causes no chamber pollution. In addition, the gas CO, as the main etching gas, also etches away no gate insulating film under the gate metal layer.

Figure 1:
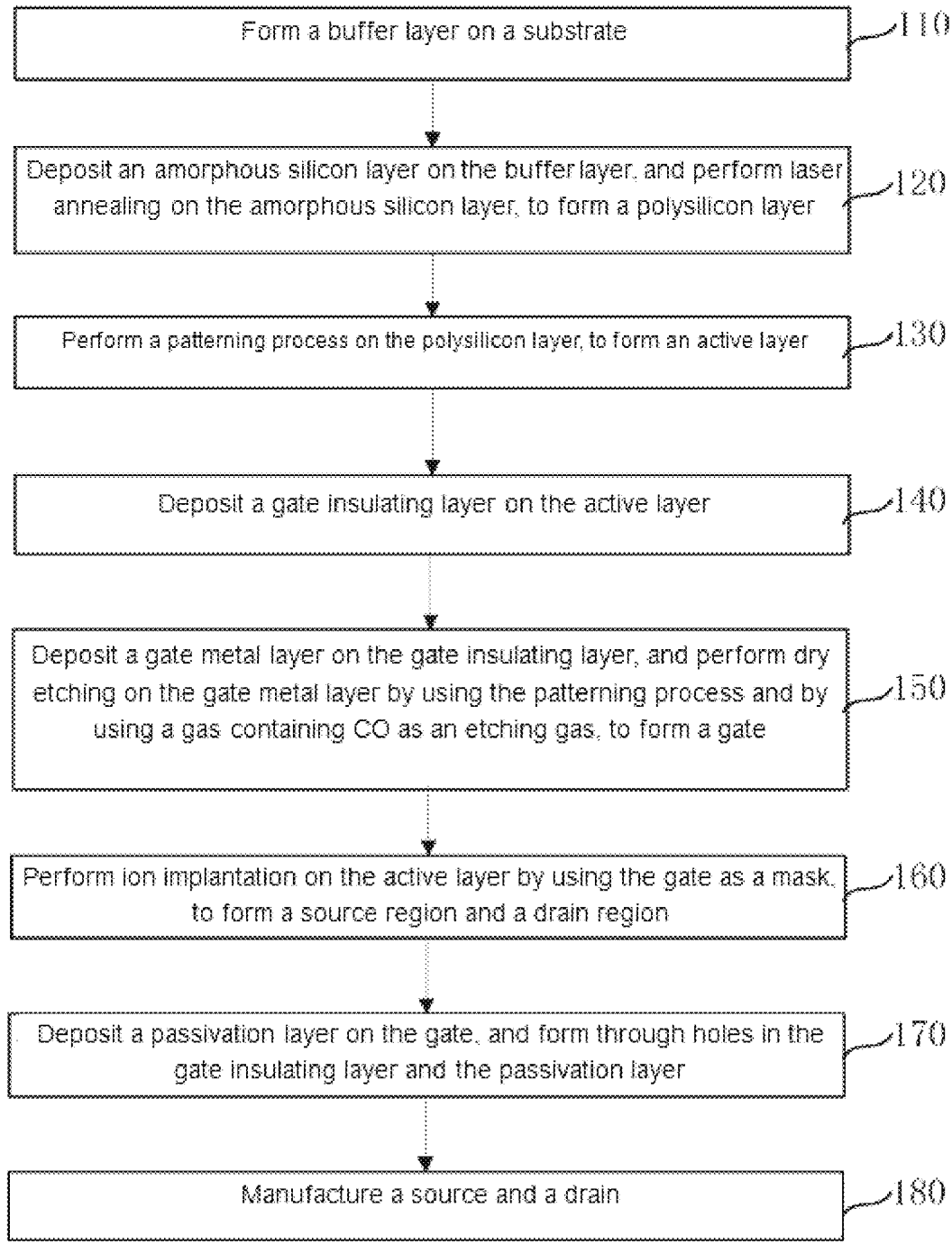
FIG. 1 is a schematic flowchart of a method for manufacturing a thin-film transistor according to an embodiment.

For example, as shown in FIG. 1, a method for manufacturing a thin-film transistor specifically includes following steps.

Step 110: Form a buffer layer on a substrate.

Figure 2A:
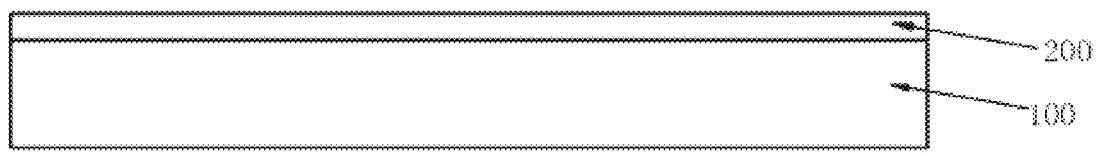
FIG. 2A to FIG. 2G are respectively schematic structural diagrams generated in steps in a process of manufacturing a thin-film transistor shown in FIG. 1.

Referring to FIG. 2A, a buffer layer 200 is formed on a clean substrate 100, and the substrate 100 may be a glass substrate or a flexible substrate. The formed buffer layer 200 may increase an adherence degree between a to-be-formed amorphous silicon layer and the substrate. In addition, metal ions in the substrate may be further prevented from spreading to the active layer, thereby reducing impurity defects and leakage currents.

Specifically, one buffer layer having a thickness is deposited on the glass substrate through plasma enhanced chemical vapor deposition (PECVD). A deposition material may be a single-layer silicon oxide ($SiO_x$) film or a silicon nitride ($SiN_x$) film, or a stack of silicon oxide ($SiO_x$) and silicon nitride ($SiN_x$).

A reaction gas forming the $SiN_x$ film may be a gas obtained by mixing $SiH_4$, $NH_3$, and $N_2$ or a gas obtained by mixing $SiH_2Cl_2$, $NH_3$, and $N_2$. A reaction gas forming the $SiO_x$ film may be a gas obtained by mixing $SiH_4$ and $N2O$ or a gas obtained by mixing $SiH_4$ and tetraethyl orthosilicate (TEOS).

Step 120: Deposit an amorphous silicon layer on the buffer layer, and perform laser annealing on the amorphous silicon layer, to form a polysilicon layer.

For example, the amorphous silicon layer is deposited on the buffer layer by using a plasma enhanced chemical vapor deposition (PECVD) process. For another example, deposition temperature is usually controlled to be lower than 500° C.

In this embodiment, a thickness of the amorphous silicon layer is 40 nm to 60 nm. Certainly, a proper thickness may also be selected based on a specific process requirement. For example, the thickness of the amorphous silicon layer is 42 nm to 55 nm. For another example, the thickness of the amorphous silicon layer is 45 nm, 48 nm, 50 nm, 51 nm, 52 nm, or 54 nm.

For example, a xenon chloride (XeCl) excimer laser, a krypton fluoride (KrF) excimer laser, an argon fluoride (ArF) excimer laser, or the like is used for laser annealing. For example, a wavelength of 308 nm is used for excimer laser annealing. A laser beam is a linear light source after passing through an optical system.

For another example, a pulse repetition ratio (pulse repetition ratio) of excimer laser annealing is 300 Hz to 800 Hz. For another example, a pulse repetition ratio of excimer laser annealing is 400 Hz to 600 Hz. For another example, a scan pitch (scan pitch) is 15 μm to 30 μm. For another example, a laser energy density is 150 mJ/cm² to 600 mJ/cm². For another example, a laser energy density is 350 mJ/cm² to 500 mJ/cm². For another example, a scan rate is preferably 0.5 mm/s to 50 mm/s. For another example, a scan rate is 0.5 mm/s to 50 mm/s or 1 mm/s to 30 mm/s. For another example, a scan rate is 2 mm/s to 10 mm/s.

Preferably, before the laser annealing process is performed, dehydrogenation processing needs to be performed on the amorphous silicon layer, so that a hydrogen content decreases to be lower than 2%, thereby avoiding hydrogen explosion. For example, hydrogen is discharged from the amorphous silicon layer through thermal annealing.

Step 130: Perform a patterning process on the polysilicon layer, to form an active layer.

For example, specifically, the step includes the following steps.

Figure 2B:
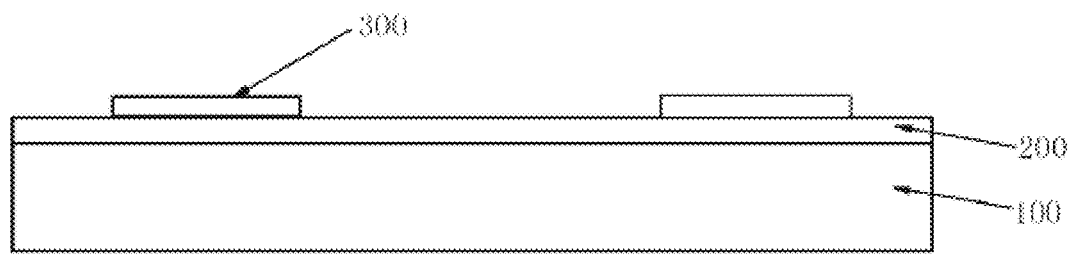

Step 1: Form a mask by using a photoetching process, and form a pattern through dry etching, to form the active layer 300 including a source region, a drain region, and a channel region. For a cross section of a structure obtained after step 1 is completed, refer to FIG. 2B.

Step 2: Perform ion implantation on the active layer, to form channel doping.

To dope a channel is to adjust a threshold voltage of a device. For example, when a threshold voltage of the thin-film transistor needs to move to a positive direction, the active layer is doped with boron. When the threshold voltage of the thin-film transistor needs to move to a negative direction, the active layer is doped with phosphorus or arsenic. However, if the threshold voltage does not need to be adjusted based on the process, no ion implantation needs to be performed on the active layer for channel doping.

Based on a requirement of the threshold voltage of the thin-film transistor, an implanted medium is a gas containing arsenic or phosphorus. For example, when the gas containing arsenic needs to be implanted, for example, a gas obtained by mixing $B_2He$ and $H_2$ is used as an implanted medium, for another example, a ratio of $B_2He$ to $H_2$ is 1% to 30%, an implantation energy range is 2 KeV to 50 KeV, a preferred energy range is 4 KeV to 10 KeV, and an implantation dose range is 0 atoms/cm³ to $5\times10^{13}$ atoms/cm³. Preferably, the implantation dose range is 0 atoms/cm³ to $9\times10^{12}$ atoms/cm³. For another example, when the gas containing phosphorus needs to be implanted, for example, a gas obtained by mixing $PH_3$ and $H_2$ is used as an implanted medium, for example, a ratio of $PH_3$ to $H_2$ is 1% to 30%, an implantation energy range is 5 KeV to 50 KeV, a preferred energy range is 7 KeV to 20 KeV, and an implantation dose range is 0 atoms/cm$^3$ to $5\times10^{13}$ atoms/cm$^3$. Preferably, the implantation dose range is 0 atoms/cm$^3$ to $9\times10^{12}$ atoms/cm$^3$.

Figure 2C:
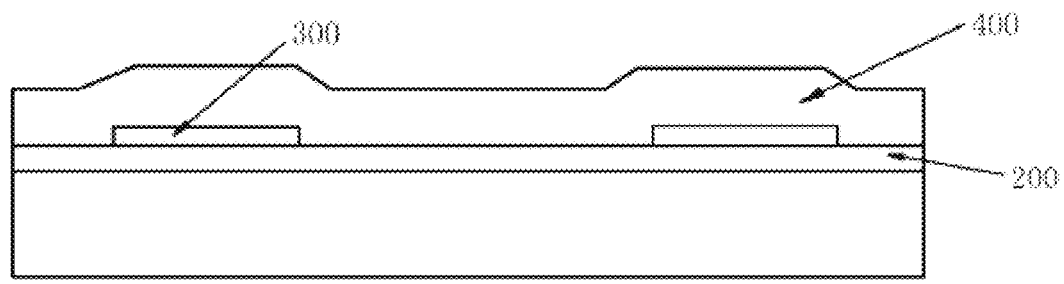

Step 140: Deposit a gate insulating layer 400 on the active layer 300. For a cross section of a structure obtained after the step is completed, refer to FIG. 2C.

For example, the gate insulating layer is formed, through chemical vapor deposition, on the substrate on which the active layer is formed. For another example, deposition temperature is usually controlled to be lower than 500° C. For another example, a thickness of the gate insulating layer may be 80 nm to 200 nm, or a proper thickness may be selected based on a specific process requirement. For another example, the gate insulating layer uses a single layer of silicon oxide or silicon nitride, or a stack of the two.

Figure 2D:
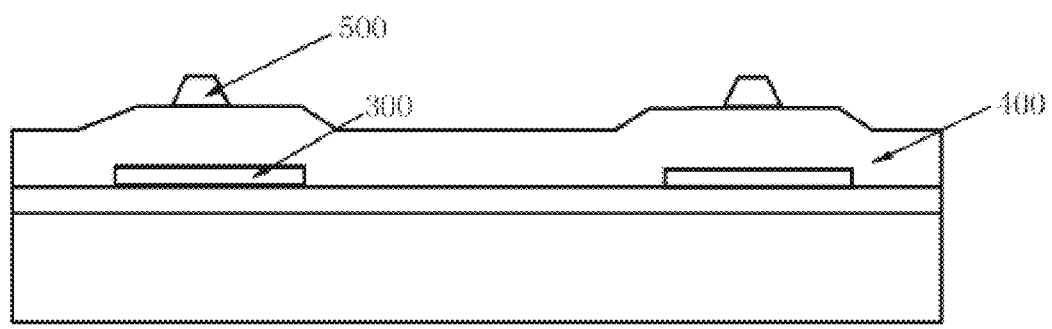

Step 150: Deposit a gate metal layer on the gate insulating layer 400, and perform dry etching on the gate metal layer by using the patterning process and by using a gas containing CO as an etching gas, to form a gate 500. For a cross section of a structure obtained after the step is completed, refer to FIG. 2D.

For example, the gate metal layer is deposited by using a method such as sputtering, thermal evaporation, plasma enhanced chemical vapor deposition (PECVD), low pressure chemical vapor deposition (LPCVD), atmospheric pressure chemical vapor deposition (APCVD), or electron cyclotron resonance microwave plasma chemical vapor deposition (ECR-CVD), and then exposure, development, and etching are performed by using a mask (mask) and by using the patterning process, to pattern the gate metal layer to form a gate.

For example, a material of the gate metal layer is molybdenum, tungsten, or a molybdenum-tungsten alloy. For another example, a combination of the foregoing several materials is used. In this embodiment, a thickness of the gate metal layer is 100 nm to 800 nm. For example, the thickness of the gate metal layer is 400 nm. Certainly, a proper thickness of the gate metal layer may also be selected based on a specific process requirement.

In the dry etching process, the gas containing CO is used as the etching gas. For example, dry etching is performed as reactive ion etching. For example, dry etching is performed as plasma etching. For example, dry etching is performed as inductance coupling plasma etching. For example, when plasma etching is performed on the gate metal layer by using the gas containing CO as the etching gas, a plasma radio source power (source power) of an etcher is 4000 W to 6000 W, and a bias radio source power (bias power) is 800 W to 1200 W. For example, the plasma radio source power (source power) of the etcher is 5000 W. For example, the bias radio source power (bias power) is 1000 W. For example, air pressure in an etching chamber is 4 Pa to 6 Pa. For example, the air pressure in the etching chamber is 5 Pa. For example, a flow of the gas CO is 400 sccm to 600 sccm. For example, the flow of the gas CO is 500 sccm.

The gate metal layer is deposited on the gate insulating layer, and dry etching is performed on the gate metal layer by using the patterning process and by using the gas containing CO as the etching gas, for example, to form the gate. For example, dry etching is performed on the gate metal layer by using a gas, as the etching gas, obtained by mixing the gas CO and a gas $O_2$, to form a gate. For example, dry etching is performed on the gate metal layer by using a gas, as the etching gas, obtained by mixing the gas CO and an inert gas (such as He, Ar, or Ne), to form a gate. For example, dry etching is performed on the gate metal layer by using a gas, as the etching gas, obtained by mixing the gas CO and a gas $Cl_2$, to form a gate. For example, dry etching is performed on the gate metal layer by using a gas, as the etching gas, obtained by mixing CO and at least one of a gas $O_2$, an inert gas, and a gas $Cl_2$, to form a gate.

In this embodiment, for example, a material of the gate metal layer is Mo. If CO is used as the main etching gas for a reaction, to generate $Mo(CO)_6$, at a process temperature of 80° C., vapor pressure of $Mo(CO)_6$ is $1.0*(e^1$ to $e^2)$ mmHg. However, if a gas obtained by mixing $Cl_2$ and $O_2$ as the etching gas for a reaction, to generate $MoCl_2O_2$, $MoCl_4O$, or the like, at a process temperature of 80° C., vapor pressure of $MOCl_2O_2$ is around $5.0*(e^{-1}$ to $e^0)$ mmHg, and vapor pressure of $MOCl_4O$ is around $5.0*(e^{-1}$ to $e^0)$ mmHg. Therefore, it may be learned that vapor pressure of a reaction resultant obtained by using CO as the main etching gas is far greater than vapor pressure of a reaction resultant obtained by using the gas, as the etching gas, obtained by mixing $Cl_2$ and $O_2$. Therefore, the reaction resultant obtained by using CO as the main etching gas has higher vapor pressure, and does not adhere to the etching chamber, so that chamber pollution can be avoided. In addition, the gas CO, as the main etching gas, also etches away no gate insulating film under the gate metal layer.

To reduce a time for a process of forming the gate by using the gate metal layer, for example, in a patterning process, when an etching process is performed after exposure and development are performed by using a mask (mask), before dry etching is performed on the gate metal layer by using the patterning process and by using the gas containing CO as the etching gas, to form the gate, the method further includes the following step:

performing tentative dry etching on the gate metal layer by using a gas containing $SF_6$ as the etching gas, to etch away a gate metal layer having a first thickness, so that a gate metal layer having a second thickness remains.

In other words, two-step etching is performed: first-step etching and second-step etching. During first-step etching, tentative dry etching is performed on the gate metal layer by using the gas containing $SF_6$ as the etching gas, to etch away the gate metal layer having the first thickness, so that gate metal layer having the second thickness remains. During second-step etching, dry etching is performed on the remaining gate metal layer having the second thickness by using the gas containing CO as the etching gas, to form a gate. For example, during first-step etching, a flow of the gas $SF_6$ is 400 sccm to 600 sccm. For example, the flow of the gas $SF_6$ is 500 sccm.

Tentative dry etching is performed on the gate metal layer by using the gas containing $SF_6$ as the etching gas, to etch away the gate metal layer having the first thickness, so that the gate metal layer having the second thickness remains. For example, tentative dry etching is performed on the gate metal layer by using the gas containing $SF_6$ as the etching gas, to etch away the gate metal layer having the first thickness, so that the gate metal layer having the second thickness remains. For example, tentative dry etching is performed on the gate metal layer by using a gas, as the etching gas, obtained by mixing the gas $SF_6$ and the gas $O_2$, to etch away a gate metal layer having a first thickness, so that a gate metal layer having a second thickness remains. For example, tentative dry etching is performed on the gate metal layer by using a gas, as the etching gas, obtained by mixing the gas $SF_6$ and the inert gas (such as He, Ar, or Ne), to etch away a gate metal layer having a first thickness, so that a gate metal layer having a second thickness remains. Tentative dry etching is performed on the gate metal layer by using a gas, as the etching gas, obtained by mixing the gas $SF_6$, the gas CO, and the gas $Cl_2$, to etch away a gate metal layer having a first thickness, so that a gate metal layer having a second thickness remains. For example, tentative dry etching is performed on the gate metal layer by using a gas, as the etching gas, obtained by mixing $SF_6$ and at least one of the gas $O_2$, the inert gas, the gas CO, and the gas $Cl_2$, to etch away the gate metal layer having a first thickness, so that the gate metal layer having a second thickness remains.

For example, tentative dry etching is performed on the gate metal layer by using the gas, as the etching gas, obtained by mixing SF and $O_2$, to etch away the gate metal layer having the first thickness, so that the gate metal layer having the second thickness remains. During first-step etching, a flow of the gas $SF_6$ is 400 sccm to 600 sccm, and a flow of $O_2$ is 100 sccm to 300 sccm. For example, the flow of the gas $SF_6$ is 500 sccm, and the flow of the gas $O_2$ is 200 sccm. For example, during second-step etching, a flow of the gas CO is 400 sccm to 600 sccm. For example, the flow of the gas CO is 500 sccm.

Because an etching rate obtained by using the gas containing $SF_6$ as the etching gas is high, the gas containing $SF_6$ is first used as the etching gas to etch away the gate metal layer having the first thickness, and then the gas containing CO is then used as the etching gas to etch away the remaining gate metal layer having the second thickness, to avoid etching away a gate insulating film under the gate metal layer, thereby greatly reducing the time for the process of forming the gate by using the gate metal layer.

For example, a ratio of the first thickness to the second thickness is 1 to 2:1. For example, a ratio of the first thickness to the second thickness is 1.5:1. For example, a thickness of the gate metal layer is 250 nm, the first thickness is 150 nm, and the second thickness is 100 nm. The gas containing $SF_6$ is first used as the etching gas to etch away the gate metal layer having the first thickness, and then the gas containing CO is then used as the etching gas to etch away the remaining gate metal layer having the second thickness, to avoid etching away the gate insulating film under the gate metal layer, thereby greatly reducing the time for the process of forming the gate by using the gate metal layer. For example, the second thickness is 50 nm to 150 nm. For example, the second thickness is 100 nm. In this way, regardless of the thickness of the gate metal layer, only a small part of the gate metal layer is reserved and etched by using the gas containing CO, thereby accelerating a rate in the entire etching process, and reducing the time for the process of forming the gate by using the gate metal layer.

Figure 2E:
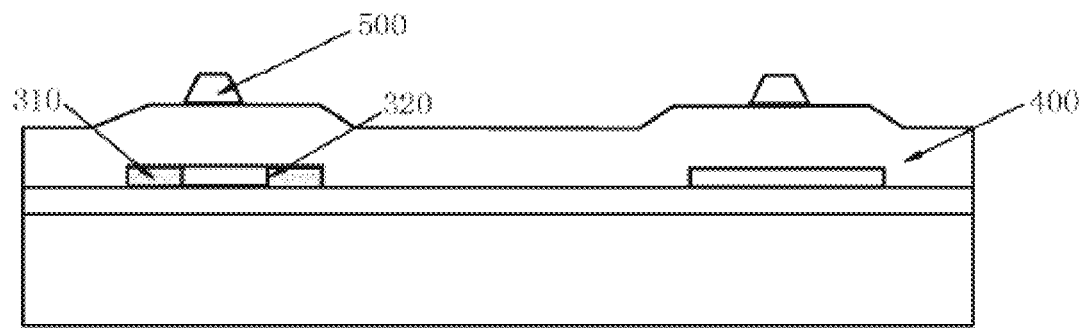

Step 160: Perform ion implantation on the active layer 300 by using the gate 500 as the mask, to from a source region 310 and a drain region 320. For a cross section of a structure obtained after the step is completed, refer to FIG. 2E.

For example, a manner of performing ion implantation by using a mass analyzer is used in this embodiment. For another example, based on a design requirement, an implanted medium is a gas containing arsenic or phosphorus, to form a P-type or N-type thin-film transistor. For example, when the gas containing arsenic is used, for example, a gas obtained by mixing $B_2H_6$ and $H_2$ is used as an implanted medium, for example, a ratio of $B_2H_6$ to $H_2$ is 1% to 30%, an implantation energy range is 5 KeV to 50 KeV, and a preferred energy range is 20 KeV to 30 KeV, and an implantation dose range is $1\times10^{13}$ atoms/cm³ to $1\times10^{17}$ atoms/cm³. Preferably, the implantation dose range is $5\times10^{14}$ atoms/cm³ to $5\times10^{15}$ atoms/cm³. For another example, when the gas containing phosphorus is used, for example, a gas obtained by mixing $PH_3$ and $H_2$ is used as an implanted medium, for example, a ratio of $PH_3$ to $H^2$ is 1% to 30%; an implantation energy range is 20 KeV to 110 KeV, and a preferred energy range is 50 KeV to 70 KeV, and an implantation dose range is $1\times10^{13}$ atoms/cm³ to $1\times10^{17}$ atoms/cm³. Preferably, the implantation dose range is $5\times10^{14}$ atoms/cm³ to $5\times10^{15}$ atoms/cm³.

Figure 2F:
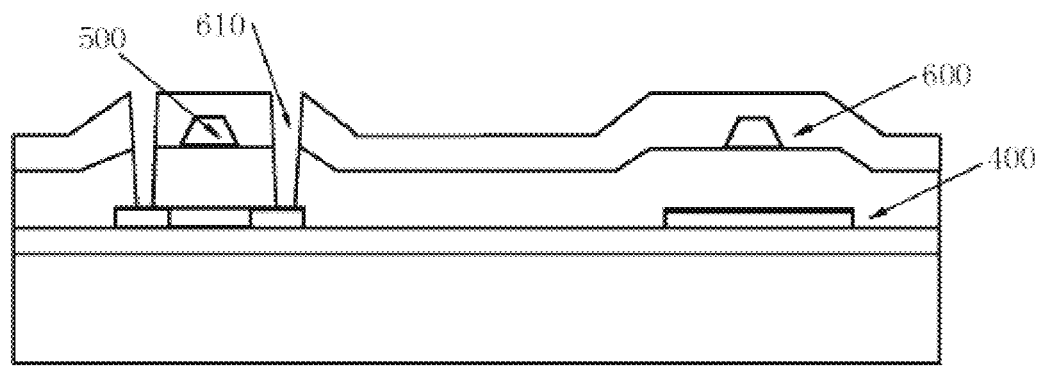

Step 170: Deposit a passivation layer 600 on the gate 500, and form through holes in the gate insulating layer 400 and the passivation layer 600. For a cross section of a structure obtained after the step is completed, refer to FIG. 2F.

Specifically, a passivation layer having a thickness of 200 nm to 800 nm may be deposited by using a chemical vapor deposition process. For example, the passivation layer is oxide, nitride, or an oxygen nitrogen compound. For another example, the passivation layer is of a single-layer structure or a multi-layer structure. For another example, a gas used for forming the passivation layer is $SiH_4$, $NH_3$, $N_2$, $SiH_4$, or $N_2O$.

For example, the mask is formed by using a photoetching process and through dry etching, and the through holes are formed in the passivation layer and the gate insulating layer to expose the source region and the drain region. In the dry etching process, a gas such as SF6, CF4, CHF3, or CCl2F2 containing fluorine or chlorine, or a gas obtained by mixing the foregoing gas and $O_2$ may be used as an etching medium, and etching is performed through reactive ion etching, plasma etching, or inductance coupling plasma etching.

Step 180: Manufacture a source 710 and a drain 720. For a cross section obtained after the step is completed, refer to FIG. 2G.

Figure 2G:
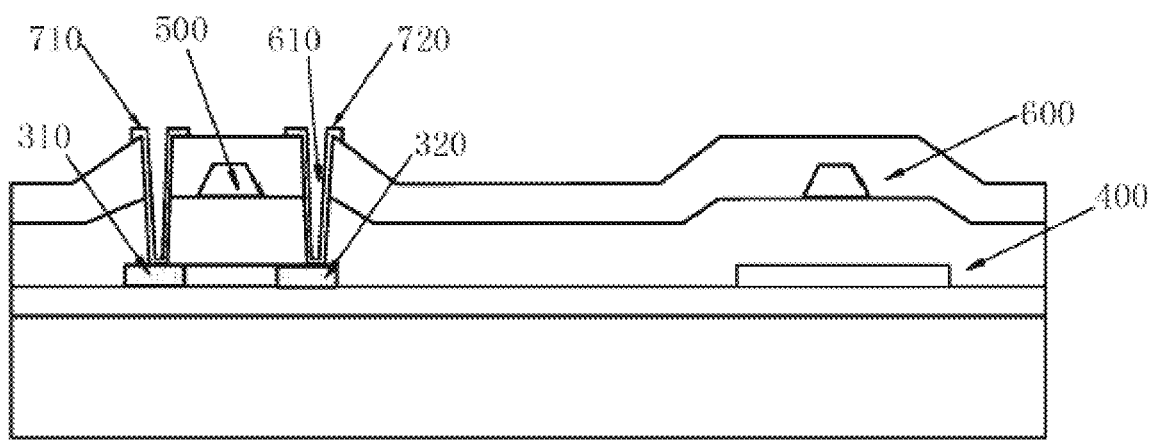

Specifically, a metal layer is formed on the passivation layer through sputtering, thermal evaporation, plasma enhanced chemical vapor deposition, low pressure chemical vapor deposition, atmospheric pressure chemical vapor deposition, or electron cyclotron resonance chemical vapor deposition. On the metal layer, a photoresist mask is formed with a photoresist by using a photolithography process, and a pattern including a source and a drain is formed through wet etching or dry etching. Referring to FIG. 2G, the source 710 passes through the through holes 610 and is electrically connected to the source region 310, and the drain 720 passes through the through holes 610 and is electrically connected to the drain region 320.

In this way, the thin-film transistor on the array substrate including the gate, the source, and the drain is manufactured by using the method, and the gate line, the data cable, and the pixel electrode that are on the array substrate may be obtained by using a conventional process. Based on a structure requirement of the array substrate, a display panel may be finally formed by using a conventional process, and a display device is further formed.

For another example, a thin-film transistor is provided and manufactured by using the manufacturing method in any one of the foregoing embodiments.

For another example, an array substrate is provided, including a substrate, and a thin-film transistor, a gate line, a data cable, and a pixel electrode that are disposed on the substrate. The thin-film transistor is manufactured by using the manufacturing method in any one of the foregoing embodiments.

In this embodiment, a display device is provided, including the array substrate in any one of the foregoing embodiments. For example, the display device is a product or component having a display function. For example, the display device is a liquid crystal panel, electronic paper, an OLED panel, a mobile phone, a tablet computer, a television, a display, a notebook computer, a digital photo frame, or a navigator.

The technical features of the foregoing embodiments can be arbitrarily combined. In order to simplify the descriptions, all possible combinations of the technical features in the above embodiments have not been described. However, as long as there is no contradiction in the combinations of these technical features, it should be considered as the scope described in this specification.

The foregoing embodiments only express several implementations of the present invention Descriptions of the foregoing embodiments are relatively specific and detailed, but cannot be understood as limiting the scope of the patent for the present invention. It should be noted that, for those of ordinary skill in the art, without departing from the concept of the present invention, modifications and improvements can be made, and all belong to the protection scope of the present invention. Therefore, the protection scope of the patent for the present invention shall be subject to the appended claims.

What is claimed is:

1. A method for manufacturing a thin-film transistor, comprising:
   forming a buffer layer on a substrate;
   forming a polysilicon layer on the buffer layer;
   performing a patterning process on the polysilicon layer, to form an active layer;
   depositing a gate insulating layer on the active layer;
   depositing a gate metal layer on the gate insulating layer, and performing dry etching on the gate metal layer by using the patterning process and by using a gas containing CO as an etching gas, to form a gate; a material of the gate metal layer is molybdenum, tungsten, or a molybdenum-tungsten alloy
   performing ion implantation on the active layer by using the gate as a mask, to form a source region and a drain region; and
   depositing a passivation layer on the gate, forming through holes in the gate insulating layer and the passivation layer, and manufacturing a source metal layer and a drain metal layer;
   before the performing dry etching on the gate metal layer by using a gas containing CO as an etching gas, to form a gate, further comprising:
   performing tentative dry etching on the gate metal layer by using a gas containing $SF_6$ as the etching gas, to etch away a gate metal layer of a first thickness, so that a gate metal layer of a second thickness is left; a flow of the gas $SF_6$ is 400 sccm to 600 sccm.

2. The method for manufacturing the thin-film transistor according to claim 1, wherein tentative dry etching is performed on the gate metal layer by using a gas, as the etching gas obtained by mixing $SF_6$ and at least one of a gas $O_2$, an inert gas, the gas CO, and a gas $Cl_2$, to etch away the gate metal layer of the first thickness, so that the gate metal layer of the second thickness is left.

3. The method for manufacturing the thin-film transistor according to claim 1, wherein a ratio of the first thickness to the second thickness is 1 to 2:1.

4. The method for manufacturing the thin-film transistor according to claim 1, wherein the second thickness is 50 nm to 150 nm.

5. The method for manufacturing the thin-film transistor according to claim 1, wherein a thickness of the gate metal layer is 100 nm to 800 nm.

6. The method for manufacturing the thin-film transistor according to claim 5, wherein power of a plasma radio source of an etcher is 4000 W to 6000 W.

7. The method, for manufacturing the thin-film transistor according to claim 1, wherein a thickness of the passivation layer is 200 nm to 800 nm.

8. The method for manufacturing the thin-film transistor according to claim 7, wherein power of a biasing radio source is 800 W to 1200 W.

9. The method for manufacturing the thin-film transistor according to claim 1, wherein plasma etching is performed on the gate metal layer by using the gas containing CO as the etching gas, to form a gate.

10. The method for manufacturing the thin-film transistor according to claim 9, wherein an air pressure in an etching chamber is 4 Pa to 6 Pa.

11. The method for manufacturing the thin-film transistor according to claim 1, wherein a flow of the gas CO is 400 sccm to 600 sccm.

12. The method for manufacturing the thin-film transistor according to claim 1, wherein dry etching is performed on the gate metal layer by using a gas, as an etching gas, obtained by mixing the gas CO and a gas $O_2$, to form a gate.

13. The method for manufacturing the thin-film transistor according to claim 1, wherein dry etching is performed on the gate metal layer by using a gas, as an etching gas, obtained by mixing the gas CO and an inert gas, to form a gate.

14. The method for manufacturing the thin-film transistor according to claim 1, wherein dry etching is performed on the gate metal layer by using a gas, as an etching gas, obtained by mixing the gas CO and a gas $Cl_2$, to form a gate.

15. A thin-film transistor, manufactured by using the manufacturing method according to claim 1.

16. An array substrate, comprising a substrate, and a gate line, a data cable, a pixel electrode, and the thin-film transistor according to claim 15 that are disposed on the substrate.

17. A display device, comprising the array substrate according to claim 15.

* * * * *